United States Patent
Koldiaev et al.

(10) Patent No.: US 11,415,617 B2
(45) Date of Patent: *Aug. 16, 2022

(54) FIELD-BIASED SECOND HARMONIC GENERATION METROLOGY

(71) Applicant: FemtoMetrix, Inc., Irvine, CA (US)

(72) Inventors: Viktor Koldiaev, Morgan Hill, CA (US); Marc Kryger, Fountain Valley, CA (US); John Changala, Tustin, CA (US)

(73) Assignee: FemtoMetrix, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/703,709

(22) Filed: Dec. 4, 2019

(65) Prior Publication Data

US 2020/0348348 A1    Nov. 5, 2020

Related U.S. Application Data

(63) Continuation of application No. 15/799,594, filed on Oct. 31, 2017, now Pat. No. 10,663,504, which is a
(Continued)

(51) Int. Cl.
*G01R 29/24* (2006.01)
*G01N 21/63* (2006.01)
(Continued)

(52) U.S. Cl.
CPC .......... *G01R 29/24* (2013.01); *G01N 21/636* (2013.01); *G01N 21/8806* (2013.01);
(Continued)

(58) Field of Classification Search
CPC ................ G01R 31/2644; G01R 31/2601; G01R 29/24; G01N 21/8806; G01N 21/9501;
(Continued)

(56) References Cited

U.S. PATENT DOCUMENTS 3,850,508 A    11/1974 Sittig et al.
4,286,215 A    8/1981 Miller
(Continued)

FOREIGN PATENT DOCUMENTS

EP    0 378 061    7/1990
EP    0 710 848    5/1996
(Continued)

OTHER PUBLICATIONS

Vanbel et al. "Tunneling of holes is observed by second harmonic generation", Appl. Phys. Lett. 102, 082104, Feb. 27, 2013, pp. 082104-1 to 082104-4 (Year: 2013).*
(Continued)

*Primary Examiner* — Jermele M Hollington
*Assistant Examiner* — Courtney G McDonnough
(74) *Attorney, Agent, or Firm* — Knobbe, Martens, Olson & Bear, LLP

(57) ABSTRACT

Various approaches can be used to interrogate a surface such as a surface of a layered semiconductor structure on a semiconductor wafer. Certain approaches employ Second Harmonic Generation and in some cases may utilize pump and probe radiation. Other approaches involve determining current flow from a sample illuminated with radiation. Decay constants can be measured to provide information regarding the sample. Additionally, electric and/or magnetic field biases can be applied to the sample to provide additional information.

12 Claims, 6 Drawing Sheets

Related U.S. Application Data continuation of application No. 14/690,251, filed on Apr. 17, 2015, now abandoned.

(60) Provisional application No. 61/980,860, filed on Apr. 17, 2014.

(51) Int. Cl.

| | | |
|---|---|---|
| *G01N 21/88* | (2006.01) | |
| *G01N 21/94* | (2006.01) | |
| *G01N 21/95* | (2006.01) | |
| *G01N 27/00* | (2006.01) | |
| *H01L 21/66* | (2006.01) | |
| *G01R 31/26* | (2020.01) | |
| *G01R 31/265* | (2006.01) | |
| *G01R 31/28* | (2006.01) | |
| *G01R 31/308* | (2006.01) | |

(52) U.S. Cl.
CPC ......... *G01N 21/94* (2013.01); *G01N 21/9501* (2013.01); *G01N 27/00* (2013.01); *G01R 31/2601* (2013.01); *G01R 31/2656* (2013.01); *G01R 31/2831* (2013.01); *G01R 31/308* (2013.01); *H01L 22/12* (2013.01); *G01N 2201/06113* (2013.01)

(58) Field of Classification Search
CPC ...... G01N 21/94; G01N 21/636; G01N 27/00; G01N 2201/06113; H01L 22/12
USPC .................................................. 324/754.23
See application file for complete search history.

(56) References Cited

U.S. PATENT DOCUMENTS

| | | | |
|---|---|---|---|
| 4,291,961 A | | 9/1981 | Takayama |
| 4,812,756 A | | 3/1989 | Curtis et al. |
| 5,294,289 A | * | 3/1994 | Heinz ................. B24B 37/013 118/712 |
| 5,557,409 A | | 9/1996 | Downer et al. |
| 5,748,317 A | | 5/1998 | Maris et al. |
| 5,814,820 A | | 9/1998 | Dong et al. |
| 5,844,684 A | | 12/1998 | Maris et al. |
| 6,147,799 A | | 11/2000 | MacDonald |
| 6,321,601 B1 | | 11/2001 | Maris |
| 6,356,377 B1 | | 3/2002 | Bishop et al. |
| 6,650,800 B2 | | 11/2003 | Litvin |
| 6,795,175 B2 | | 2/2004 | Hunt |
| 6,751,374 B2 | | 6/2004 | Wu et al. |
| 6,781,686 B2 | | 8/2004 | Hunt |
| 6,788,405 B2 | | 9/2004 | Hunt |
| 6,791,099 B2 | | 9/2004 | Some et al. |
| 6,803,777 B2 | | 10/2004 | Pfaff et al. |
| 6,819,844 B2 | | 11/2004 | Hunt |
| 6,856,159 B1 | | 2/2005 | Tolk et al. |
| 6,858,859 B2 | | 2/2005 | Kusunose |
| 6,882,414 B2 | | 4/2005 | Hunt |
| 6,898,359 B2 | | 5/2005 | Soljacic et al. |
| 6,900,894 B2 | | 5/2005 | McMillen et al. |
| 7,158,284 B2 | | 1/2007 | Alles et al. |
| 7,202,691 B2 | | 4/2007 | Lagowski et al. |
| 7,248,062 B1 | | 7/2007 | Samsavar et al. |
| 7,259,868 B2 | | 8/2007 | Ozcan et al. |
| 7,304,305 B2 | | 12/2007 | Hunt |
| 7,324,267 B2 | | 1/2008 | Melloni et al. |
| 7,333,192 B2 | | 2/2008 | Nakano et al. |
| 7,355,618 B2 | | 4/2008 | Seto et al. |
| 7,362,496 B2 | | 4/2008 | Boretz et al. |
| 7,433,056 B1 | | 10/2008 | Janik |
| 7,580,138 B2 | | 8/2009 | Price |
| 7,592,828 B2 | | 9/2009 | Song |
| 7,595,204 B2 | | 9/2009 | Price |
| 7,616,307 B2 | | 11/2009 | Murtagh et al. |
| 7,659,979 B2 | | 2/2010 | Murtagh et al. |
| 7,684,047 B2 | | 3/2010 | Drake et al. |
| 7,718,969 B2 | | 5/2010 | Zhang et al. |
| 7,781,739 B1 | | 8/2010 | Jannson et al. |
| 7,830,527 B2 | | 11/2010 | Chen |
| 7,893,703 B2 | | 2/2011 | Rzepiela et al. |
| 7,894,126 B2 | | 2/2011 | Gunter et al. |
| 7,982,944 B2 | | 7/2011 | Kippenberg et al. |
| 8,049,304 B2 | | 11/2011 | Srividya et al. |
| 8,143,660 B2 | | 3/2012 | Lee et al. |
| 8,264,693 B2 | | 9/2012 | Stoica et al. |
| 8,525,287 B2 | | 9/2013 | Tian et al. |
| 8,573,785 B2 | | 11/2013 | Kuksenkov et al. |
| 8,693,301 B2 | | 4/2014 | Knittel et al. |
| 8,755,044 B2 | | 6/2014 | Reich et al. |
| 9,018,968 B2 | | 4/2015 | Huang et al. |
| 9,194,908 B2 | | 11/2015 | Heidmann |
| 9,285,338 B2 | | 3/2016 | Dickerson et al. |
| 9,554,738 B1 | | 1/2017 | Gulati et al. |
| 9,652,729 B2 | | 5/2017 | Hoffman, Jr. et al. |
| 9,759,656 B2 | | 9/2017 | Ito et al. |
| 10,274,310 B2 | | 4/2019 | Hunt et al. |
| 10,371,668 B2 | | 8/2019 | Garnett et al. |
| 10,551,325 B2 | | 2/2020 | Koldiaev et al. |
| 10,591,525 B2 | | 3/2020 | Koldiaev et al. |
| 10,591,526 B1 | | 3/2020 | Chowdhury et al. |
| 10,613,131 B2 | | 4/2020 | Koldiaev et al. |
| 10,663,504 B2 | | 5/2020 | Koldiaev et al. |
| 10,942,116 B2 | | 3/2021 | Prater et al. |
| 11,002,665 B2 | | 5/2021 | Prater et al. |
| 2003/0148391 A1 | | 8/2003 | Salafsky |
| 2005/0058165 A1 | | 3/2005 | Morehead et al. |
| 2006/0044641 A1 | * | 3/2006 | Alles ................. G01N 21/63 359/328 |
| 2009/0212769 A1 | * | 8/2009 | Stoica ................. G01R 33/1284 324/244.1 |
| 2010/0177301 A1 | * | 7/2010 | Hempstead ........... G01M 11/35 356/73.1 |
| 2010/0186512 A1 | * | 7/2010 | Goto .................... G01N 29/075 73/632 |
| 2010/0208757 A1 | | 8/2010 | Hu |
| 2010/0272134 A1 | | 10/2010 | Blanding et al. |
| 2011/0125458 A1 | | 5/2011 | Xu et al. |
| 2012/0019816 A1 | | 1/2012 | Shibata |
| 2013/0003070 A1 | | 1/2013 | Sezaki et al. |
| 2015/0330908 A1 | | 11/2015 | Koldiaev et al. |
| 2015/0330909 A1 | | 11/2015 | Koldiaev et al. |
| 2015/0331029 A1 | | 11/2015 | Koldiaev et al. |
| 2015/0331036 A1 | | 11/2015 | Koldiaev et al. |
| 2017/0067830 A1 | | 3/2017 | Adell et al. |
| 2018/0292441 A1 | | 10/2018 | Koldiaev et al. |
| 2019/0120753 A1 | | 4/2019 | Prater et al. |
| 2020/0025677 A1 | | 1/2020 | Prater et al. |
| 2020/0057104 A1 | | 2/2020 | Ma et al. |
| 2020/0088784 A1 | | 3/2020 | Lei |
| 2020/0110029 A1 | | 4/2020 | Lei |
| 2020/0400732 A1 | | 12/2020 | Koldiaev et al. |
| 2020/0408699 A1 | | 12/2020 | Koldiaev et al. |
| 2021/0055338 A1 | | 2/2021 | Koldiaev et al. |

FOREIGN PATENT DOCUMENTS

| | | |
|---|---|---|
| EP | 3 548 854 | 10/2019 |
| JP | 2004-226224 | 8/2004 |
| JP | 2008-218957 | 9/2008 |
| TW | 200421460 | 10/2004 |
| WO | WO 97/41418 | 11/1997 |
| WO | WO 00/55885 | 9/2000 |
| WO | WO 02/065108 | 8/2002 |
| WO | WO 2015/027210 | 2/2015 |
| WO | WO 2015/161136 | 10/2015 |
| WO | WO 2016/077617 | 5/2016 |
| WO | WO 2017/041049 | 3/2017 |
| WO | WO 2018/102467 | 6/2018 |
| WO | WO 2019/210229 | 10/2019 |

(56) References Cited

FOREIGN PATENT DOCUMENTS

| WO | WO 2019/210265 | 10/2019 |
|---|---|---|
| WO | WO 2019/222260 | 11/2019 |

OTHER PUBLICATIONS

"Rapid Non-destructive Characterization of Trap Densities and Layer Thicknesses in $HfO_2$ Gate Materials Using Optical Second Harmonic Generation", Semicon Korea, Santa Ana, California, Jan. 2016, in 24 pages.
Adell, P. C. et al. "Impact of Hydrogen Contamination on the Total Dose Response of Linear Bipolar Micocircuits", IEEE, Aug. 2007, in 8 pages.
Alles, M. et al, "Second Harmonic Generation for Noninvasive Metrology of Silicon-on-Insulators Wafers", IEEE Transactions on Semiconductor Manufacturing, vol. 20(2), May 2007, pp. 107-113, in 7 pages.
An, Y. et al., "Role of photo-assisted tunneling in time-dependent second-harmonic generation from Si surfaces with ultrathin oxides", Applied Physics Letters, vol. 102, Feb. 4, 2013, pp. 051602-051602-4, in 5 pages.
Bierwagen, O. et al., "Dissipation-factor-based criterion for the validity of carrier-type identification by capacitance-voltage measurements", Applied Physics Letters, vol. 94, Apr. 2009, pp. 152110-152110-3, in 3 pages.
Bloch, J. et al., "Electron Photoinjection from Silicon to Ultrathin $SiO_2$ Films via Ambient Oxygen", Physical Review Letters vol. 77(5), Jul. 29, 1996, pp. 920-923, in 4 pages.
Campagnola, P., "Second Harmonic Generation Imaging Microscopy: Applications to Diseases Diagnostics", Analytical Chemistry, May 2011, pp. 3224-3231, in 16 pages.
Chang, C. L. et al., "Direct determination of flat-band voltage for metal/high κ oxide/semiconductor heterointerfaces by electric-field-induced second-harmonic generation", Applied Physics Letters vol. 98, Apr. 2011, pp. 171902-171902-3, in 3 pages.
Dautrich, M. et al., "Noninvasive nature of corona charging on thermal $Si/SiO_2$ structures", Applied Physics Letters, vol. 85(10), Sep. 6, 2004, pp. 1844-1845, in 2 pages.
De Vries, J. et al., "Measuring the concentration and energy distribution of interface states using a non-contact corona oxide semiconductor method", Applied Physics Letters, vol. 100, Feb. 24, 2012, pp. 082111-082111-3, in 3 pages.
Dixit, S. K. et al., "Radiation Induced Charge Trapping in Ultrathin HfO-Based MOSFETs", IEEE Transactions on Nuclear Science, vol. 54(6), Dec. 2007, pp. 1883-1890, in 8 pages.
Erley, G. et al., "Silicon interband transitions observed at Si(100)-$SiO_2$ interfaces", Physical Review B, vol. 58(4), Jul. 15, 1998, pp. R1734-R1737, in 4 pages.
Esqueda, I. et al., "Modeling the Effects of Hydrogen on the Mechanisms of Dose Rate Sensitivity", RADECS 2011 Proceedings—A-1, Sep. 2011, pp. 1-6, in 6 pages.
Fomenko, V. et al., "Optical second harmonic generation studies of ultrathin high-k dielectric stacks", Journal of Applied Physics, American Institute of Physics, vol. 97(8), Apr. 11, 2005, in 8 pages.
Fomenko, V. et al., "Second harmonic generation investigations of charge transfer at chemically-modified semiconductor interfaces", Journal of Applied Physics, vol. 91(7), Apr. 1, 2002, pp. 4394-4398, in 5 pages.
Geiger, F., "Second Harmonic Generation, Sum Frequency Generation and $X^{(3)}$: Dissecting Environmental Interfaces with a Nonlinear Optical Swiss Army Knife", Annual Review of Physical Chemistry, vol. 60(1), Nov. 2008, pp. 61-83, in 25 pages.
Gielis, J. J. H. et al., "Negative charge and charging dynamics in $Al_2O_3$ films on Si characterized by second-harmonic generation", Journal of Applied Physics, American Institute of Physics, vol. 104(7), Nov. 2008, pp. 073701-073701-5, in 6 pages.
Gielis, J. J. H. et al.,"Optical second-harmonic generation in thin film systems", Journal of Vacuum Science Technology A, vol. 26(6), Nov./Dec. 2008, pp. 1519-1537, in 20 pages.
Glinka, Y. D. et al., "Ultrafast dynamics of interfacial electric fields in semiconductor heterostructures monitored by pump-probe second-harmonic generation", Applied Physics Letter, vol. 81(20), Nov. 11, 2002, pp. 3717-3719, in 3 pages.
Heinz, T. F. et al., "Optical Second-Harmonic Generation from Semiconductor Surfaces", Advances in Laser Science III, edited by A. C. Tam, J. L. Cole and W. C. Stwalley (American Institute of Physics, New York, 1988) p. 452, in 8 pages.
Istratov, A. et al., "Exponential analysis in physical phenomena", Review of Scientific Instruments, vol. 70(2), Feb. 1999, pp. 1233-1257, in 25 pages.
Jiang, Y. et al., "Finite difference method for analyzing band structure in semiconductor heterostructures without spurious solutions", Journal of Applied Physics, vol. 116(17), Nov. 2014, pp. 173702-173702-9, in 10 pages.
Jozwikowska, A., "Numerical solution of the nonlinear Poisson equation for semiconductor devices by application of a diffusion-equation finite difference scheme", Journal of Applied Physics, vol. 104, Oct. 2008, pp. 063715-1 to 063715-9, in 10 pages.
Jun, H. et al., "Charge Trapping in Irradiated SOI Wafers Measured by Second Harmonic Generation", IEEE Transactions on Nuclear Science, vol. 51(6), Dec. 2004, pp. 3231-3237, in 8 pages.
Kang, A. Y. et al., "The Radiation Response of the High Dielectric-Constant Hafnium Oxid/Silicon System", IEEE Transactions on Nuclear Science, vol. 49(6), Dec. 2002, pp. 2636-2642, in 7 pages.
Katsube, T. et al., "Memory Traps in MNOS Diodes Measured by Thermally Stimulated Current", Solid State Electronics, vol. 19(1), Jan. 1976, pp. 11-16, in 6 pages.
Koldyaev, V. et al., "Rapid Non-Destructive Detection of Sub-Surface Cu in Silicon-On-Insulator Wafers by Optical Second Harmonic Generation", ASMC, May 2015, in 4 pages.
Lantz, J. et al., "Time-Resolved Optical Second Harmonic Generation Measurements of Picosecond Band Flattening Processes at Single Crystal TiO2 Electrodes", The Journal of Physical Chemistry, vol. 98(38), Sep. 1994, pp. 9387-9390, in 4 pages.
Lei, M. et al., "Hot carrier injection from nanometer-thick silicon-on-insulator films measured by optical second harmonic generation", Applied Physics Letters, vol. 96, Jul. 2010, pp. 241105-241105-3, in 3 pages.
Lundstrom, I. et al., "Tunneling to traps in insulators", Journal of Applied Physics, vol. 43(12), Dec. 1972, pp. 5045-5047, in 4 pages.
Lupke, G. et al., "Electron Trapping in Ultrathin $SiO_x$ on Si(001) Probed by Electric-Field-Induced Second-Harmonic Generation", IEEE Nonlinear Optics: Materials, Fundamentals and Applications-Conference Proceedings, MC22, Aug. 1998, pp. 89-91, in 3 pages.
Mandoc, M. M. et al., "Corona Charging and Optical Second-Harmonic Generation Studies of the Field-Effect Passivation of c-Si by Al2O3 Films", IEEE, Jul. 2010, in 5 pages.
Marano, S. et al., "Sequential Detection of Almost-Harmonic Signals", IEEE Transactions on Signal Processing, vol. 51(2), Feb. 2003, pp. 395-406, in 12 pages.
Marka, Z. et al., "Band offsets measured by internal photo-emission-induced second-harmonic generation", Physical Review B, vol. 67(4), Jan. 2003, pp. 045302-045302-5, in 6 pages.
Marka, Z. et al., "Band offsets measurement of Si—$SiO_2$ interfaces by internal photoemission induced second-harmonic generation", Physical Review Journal, paper QTuM6, 2003, in 2 pages.
Marka, Z. et al., "Characterization of X-Ray Radiation Damage in $Si/SiO_2$ Structures Using Second-Harmonic Generation", IEEE Transactions on Nuclear Science, vol. 47(6), Dec. 2000, pp. 2256-2261, in 6 pages.
Marka, Z. et al., "Two-color optical technique for characterization of x-ray radiation-enhanced electron transport in $SiO_2$ ", Journal of Applied Physics, vol. 93(4), Feb. 15, 2003, pp. 1865-1870, in 6 pages.
Mihaychuk, J. G. et al, "Time-dependent second-harmonic generation from the Si—$SiO_f$ interface induced by charge transfer", Optics Letters, vol. 20(20), Oct. 1995, pp. 2063-2065, in 4 pages.
Murzina, T. et al., "Optical Second Harmonic Generation in Semiconductor Nanostructures", Physics Research International, vol. 2012, Mar. 16, 2012, in 12 pages.

(56) References Cited

OTHER PUBLICATIONS

Nagel, J. et al., "Solving the Generalized Poisson Equation Using the Anite-Difference Method (FDM)", Feb. 15, 2012, pp. 1-18, in 18 pages.

Neethling, P. H. et al., "Second harmonic generation as a technique to probe buried interfaces", South African Journal of Science, vol. 105, Jul./Aug. 2009, pp. 282-284, in 3 pages.

Park, H. et al., "Total Ionizing Dose Effects on Strained $HfO_2$-Based nMOSFETs", IEEE Transactions on Nuclear Science, vol. 55(6), Dec. 2008, pp. 2981-2985, in 5 pages.

Pasternak, R. et al., "Laser detection of radiation enhanced electron transport in ultra-thin oxides", Nuclear Instruments and Methods in Physics Research A, vol. 514, 2003, pp. 150-155, in 6 pages.

Pedersen, K. et al., "Spectroscopic second-harmonic generation from silicon-on-insulator wafers", Optical Society of America, vol. 26(5), May 2009, pp. 917-922, in 6 pages.

Powell, R. D., "The Use of Photoinjection to Determine Oxide Charge Distributions and Interface Properties in MOS Structures", IEEE Transactions on Nuclear Sciences, vol. 17(6), Jan. 1971, pp. 41-46, in 6 pages.

Price, J. et al., "Charge trapping defects in $Si/SiO_2/Hf_{(1-x)}Si_xO_f$ film stacks characterized by spectroscopic second-harmonic generation", Journal of Vacuum Science and Technology: Part B, AVS/SIP, vol. 29(4), Jul. 2011, pp. 4D101-4D101-11, in 12 pages.

Price, J. et al. "Optical second-harmonic generation study of charge trapping dynamics in $HfO_2/SiO_2$ films on Si(100)", Physica Status Solidi, vol. 5(8), Jun. 2008, pp. 2667-2670, in 4 pages.

Rai, V. N. et al., "A transistorized Marx bank circuit providing sub-nanosecond high-voltage pulses", Measurement Science and Technology, vol. 5(4), Nov. 1993, pp. 447-449, in 3 pages.

Reber, R. et al., "Thermally stimulated current measurements of $SiO_2$ defect density and energy in irradiated metal-oxide-semiconductor capacitors", Review of Scientific Instruments, vol. 63(12), Jun. 4, 1998, pp. 5714-5725, in 13 pages.

Robertson, J., "Band offsets of wide-band-gap oxides and implications for future electronic devices", Journal of Vacuum Science and Technology B, vol. 18(3), May 2000, pp. 1785-1791, in 7 pages.

Schaller, R. D. et al., "Time-Resolved Second Harmonic Generation Near-Field Scanning Optical Microscopy", CHEMPHYSCHEM, vol. 4(11), Nov. 14, 2003, pp. 1243-1247, in 5 pages.

Shaver, J. et al., "A 2D Finite Difference Simulation to Investigate the High Voltage Blocking Characteristics of 4H-SiC Photoconductive Semiconductor Switches", IEEE, 978-1-4799-8403-9/15, May 2015, pp. 193-195, in 3 pages.

Taguchi, D. et al., "Probing of carrier behavior in organic electroluminescent diode using electric field induced optical second-harmonic generation measurement", Applied Physics Letters, vol. 95, Dec. 30, 2009, pp. 263310-263310-3, in 4 pages.

Ushiki, T. et al., "Evidence of Energetically-Localized Trap-States at SOI-BOX Interface in High-Dose SIMOX Wafers", IEEE International SOI Conference, Oct. 1999, pp. 48-49, in 2 pages.

Vanbel, M. K. et al., "Electric-Field-Induced Second-Harmonic Generation Demonstrates Different Interface Properties of Molecular Beam Epitaxy Grown MgO on Si", The Journal of Physical Chemistry, vol. 118(4), Jan. 2014, in 6 pages.

Vasudevan, V. et al., "A numerical simulation of hole and electron trapping due to radiation in silicon dioxide", Journal of Applied Physics, vol. 70, Nov. 1991, pp. 4490-4495, in 7 pages.

Wang, H. et al., "Non-degenerate fs pump-probe study on InGaN with multi-wavelength second-harmonic generation", Optics Express, Jul. 11, 2005, vol. 13(14), pp. 5245-5252, in 8 pages.

Wang, W. et al., "Coupled Electron-Hole Dynamics at the $Si/SiO_2$ Interface", Physical Review Letters, vol. 81(19), Nov. 9, 1998, pp. 4224-4227, in 4 pages.

White, Y. V. et al., "Studies of charge carrier trapping and recombination processes in Si $SiO_2$ MgO structures using second-harmonic generation", Applied Physics Letters, vol. 88, Feb. 2006, pp. 062102-062102-3, in 3 pages.

Xiao, D. et al., "Optical probing of a silicon integrated circuit using electric-field-induced second-harmonic generation", Applied Physics Letters, vol. 88, Mar. 17, 2006, pp. 114107-114107-3, in 4 pages.

European Extended Search Report dated Feb. 26, 2019 in corresponding EP Application No. 16843152.6.

European Extended Search Report dated Sep. 28, 2017 in corresponding EP Application No. 15779557.6.

European Extended Search Report dated Apr. 3, 2018 in corresponding EP Application No. 15858539.8.

European Office Action dated Aug. 30, 2019 in corresponding EP Application No. 15858539.8.

International Search Report and Written Opinion dated Dec. 21, 2016 in corresponding PCT Application No. PCT/US2016/050286.

International Preliminary Report on Patentability and Written Opinion dated Mar. 6, 2018 in corresponding PCT Application No. PCT/US2016/050286.

Invitation to Pay Addition Fees and Partial Search Report dated Jul. 27, 2015 in corresponding PCT Application No. PCT/US2015/026263.

International Search Report and Written Opinion dated Sep. 23, 2015 in corresponding PCT Application No. PCT/US2015/026263.

International Preliminary Report on Patentability and Written Opinion dated Oct. 27, 2016 in corresponding PCT Application No. PCT/US2015/026263.

International Search Report and Written Option dated Feb. 26, 2016 in corresponding PCT Application No. PCT/US2015/060437.

International Preliminary Report on Patentability and Written Opinion dated May 26, 2017 in corresponding PCT Application No. PCT/US2015/060437.

International Search Report and Written Option dated Aug. 13, 2019 in corresponding PCT Application No. PCT/US2019/029485.

International Search Report and Written Opinion dated Sep. 25, 2019 in corresponding PCT Application No. PCT/US2019/032282.

International Search Report and Written Option dated Aug. 8, 2019 in corresponding PCT Application No. PCT/US2019/029439.

U.S. Office Action dated Jul. 13, 2018 in corresponding U.S. Appl. No. 15/256,442.

U.S. Office Action dated Apr. 4, 2019 in corresponding U.S. Appl. No. 15/256,442.

U.S. Office Action dated Jul. 26, 2019 in corresponding U.S. Appl. No. 15/256,442.

U.S. Office Action dated Feb. 8, 2017 in corresponding U.S. Appl. No. 14/690,179.

U.S. Office Action dated Aug. 28, 2017 in corresponding U.S. Appl. No. 14/690,179.

U.S. Office Action dated Jan. 14, 2019 in corresponding U.S. Appl. No. 15/882,433.

U.S. Office Action dated Jul. 25, 2019 in corresponding U.S. Appl. No. 15/882,433.

U.S. Office Action dated Nov. 6, 2019 in corresponding U.S. Appl. No. 15/882,433.

U.S. Office Action dated Oct. 13, 2016 in corresponding U.S. Appl. No. 14/690,256.

U.S. Office Action dated Jul. 28, 2017 in corresponding U.S. Appl. No. 14/690,256.

U.S. Office Action dated Oct. 31, 2018 in corresponding U.S. Appl. No. 15/880,308.

U.S. Office Action dated May 1, 2017 in corresponding U.S. Appl. No. 14/690,251.

U.S. Office Action dated Oct. 7, 2016 in corresponding U.S. Appl. No. 14/690,279.

U.S. Office Action dated May 8, 2017 in corresponding U.S. Appl. No. 14/690,279.

U.S. Office Action dated Sep. 18, 2018 in corresponding U.S. Appl. No. 15/806,271.

U.S. Office Action dated Mar. 29, 2019 in corresponding U.S. Appl. No. 15/806,271.

U.S. Office Action dated Oct. 28, 2019 in corresponding U.S. Appl. No. 15/806,271.

U.S. Office Action dated Feb. 5, 2018 in corresponding U.S. Appl. No. 14/939,750.

U.S. Office Action dated Jun. 26, 2018 in corresponding U.S. Appl. No. 14/939,750.

(56) References Cited

OTHER PUBLICATIONS

U.S. Office Action dated Feb. 13, 2019 in corresponding U.S. Appl. No. 14/939,750.
U.S. Office Action dated Sep. 24, 2019 in corresponding U.S. Appl. No. 14/939,750.
Aktsipetrov, O.A. et. al. dc-electric field induced and low-frequency electromodulation second-harmonic generation spectroscopy of Si(001)-SiO2 interfaces, Phys. Rev. B, vol. 60(12), Sep. 1999, pp. 8924-8938, in 15 pages.
Tian, Y. et al., "Corona Discharge Radical Emission Spectroscopy: A Multi-Channel Detector with Nose-Type Function for Discrimination Analysis", The Analyst, The Royal Society of Chemistry, vol. 138(8), Mar. 2013, in 15 pages.
Chinese Office Action dated Mar. 20, 2020 in corresponding CN Application No. 201680064010.9.
European Interview Summary Report dated Apr. 28, 2020 in corresponding EP Application No. 15779557.6.
European Office Action dated May 4, 2020 in corresponding EP Application No. 15779557.6.
International Preliminary Report on Patentability dated Nov. 5, 2020 in corresponding PCT Application No. PCT/US2019/029485.
International Preliminary Report on Patentability dated Nov. 26, 2020 in corresponding PCT Application No. PCT/US2019/032282.
International Preliminary Report on Patentability dated Nov. 5, 2020 in corresponding PCT Application No. PCT/US2019/029439.
Taiwanese Office Action dated Sep. 28, 2017 in corresponding TW Application No. 105131588.
U.S. Office Action dated May 1, 2020 in corresponding U.S. Appl. No. 15/256,442.
U.S. Office Action dated Oct. 13, 2020 in corresponding U.S. Appl. No. 15/256,442.
U.S. Office Action dated Jun. 25, 2018 in corresponding U.S. Appl. No. 15/799,594.
U.S. Office Action dated Apr. 17, 2019 in corresponding U.S. Appl. No. 15/799,594.
U.S. Office Action dated Sep. 5, 2019 in corresponding U.S. Appl. No. 15/799,594.
U.S. Office Action dated Jan. 7, 2020 in corresponding U.S. Appl. No. 15/799,594.
U.S. Office Action dated Feb. 5, 2021 in corresponding U.S. Appl. No. 16/724,042.
U.S. Office Action dated Aug. 27, 2020 in corresponding U.S. Appl. No. 16/396,455.
U.S. Office Action dated Jun. 17, 2020 in corresponding U.S. Appl. No. 16/412,216.
U.S. Office Action dated Sep. 14, 2020 in corresponding U.S. Appl. No. 16/396,227.
Chinese Office Action dated Mar. 2, 2021 in corresponding CN Application No. 201680064010.9.
U.S. Office Action dated Aug. 13, 2021 in corresponding U.S. Appl. No. 16/724,042.

\* cited by examiner

FIELD-BIASED SECOND HARMONIC GENERATION METROLOGY

CROSS-REFERENCE TO RELATED APPLICATIONS

This application is a continuation of U.S. patent application Ser. No. 15/799,594, filed on Oct. 31, 2017, which is a continuation of U.S. patent application Ser. No. 14/690,251, filed on Apr. 17, 2015, which claims benefit under 35 U.S.C. § 119(e) of U.S. Provisional Application No. 61/980,860, filed on Apr. 17, 2014, titled "WAFER METROLOGY TECHNOLOGIES," each of which are incorporated by reference herein in their entireties, including but not limited to each of the Sections I, II, III, and IV, of U.S. Provisional Application No. 61/980,860 which are each incorporated herein by reference in their entirety.

FIELD

The subject filing relates to systems for Second Harmonic Generation (SHG) based wafer inspection, semiconductor metrology, materials characterization, surface characterization and/or interface analysis.

BACKGROUND

In nonlinear optics, light beam input(s) are output as the sum, difference or harmonic frequencies of the input(s). Second Harmonic Generation (SHG) is a non-linear effect in which light is emitted from a material at a reflected angle with twice the frequency of an incident source light beam. The process may be considered as the combining of two photons of energy E to produce a single photon of energy 2E (i.e., the production of light of twice the frequency ($2\omega$) or half the wavelength) of the incident radiation.

A survey of scientific investigations in which the SHG technique has been employed is provided by, "Optical Second-Harmonic Generation from Semiconductor Surfaces" by T. F. Heinz et al., Published in Advances in Laser Science III, edited by A. C. Tam, J. L. Cole and W. C. Stwalley (American Institute of Physics, New York, 1988) p. 452. As reviewed, the SHG process does not occur within the bulk of materials exhibiting a center of symmetry (i.e., in inversion or centrosymmetric materials). For these materials, the SHG process is appreciable only at surfaces and/or interfaces where the inversion symmetry of the bulk material is broken. As such, the SHG process offers a unique sensitivity to surface and interface properties.

So-understood, the SHG effect is described in U.S. Pat. No. 5,294,289 to Heinz et al. Each of U.S. Pat. No. 5,557,409 to Downer, et al., U.S. Pat. Nos. 6,795,175; 6,781,686; 6,788,405; 6,819,844; 6,882,414 and 7,304,305 to Hunt, U.S. Pat. No. 6,856,159 to Tolk, et al. and U.S. Pat. No. 7,158,284 to Alles, et al. also describe other approaches or "tools" that may be employed. Yet, the teachings of these patents appear not to have overcome some of the main obstacles to the adoption of SHG as an established technique for use in semiconductor manufacturing and metrology.

SUMMARY

Various field-biased (e.g magnetic-field biases, DC bias and/or voltage bias induced by an AC field alone, with a capacitive coupling and/or a changing magnetic field) SHG-based systems and their methods of use are described. These are treated in turn. They may be used independently and/or in a combined system. Various embodiments described herein include each of the methodology associated with the approaches described above, hardware to carry out the methodology, productions systems incorporating the hardware and products (including products-by-process) thereof.

Magnetic Field Bias

A static or changing magnetic field applied to the sample will cause the second order optical susceptibility tensor of a material to change. Thus, a magnetic field could be used to increase SHG signal from the sample, to an optimum value. Moreover, a changing magnetic field can be used to induce bias as further discussed below.

Induced Voltage Bias for Eliminating DC Contact Probes

Systems and methods are described for characterizing the SHG response of a layered semiconductor material that is subjected to a discrete electric field across its interfaces without use of contact bias probes in a system that can synchronize the pulses of a probing laser and/or the gating of a detector with a predetermined amplitude of voltage of an AC, variable or pulsed bias applied to the sample to produce a corresponding or coordinated induced voltage field at the surface to be interrogated.

The subject hardware comprises an SHG apparatus (e.g., further described in the portion of U.S. Provisional Application No. 61/980,860, filed on Apr. 17, 2014, titled "WAFER METROLOGY TECHNOLOGIES," referred to as Section II titled, "CHARGE DECAY MEASUREMENT SYSTEMS AND METHODS," which is incorporated herein by reference in its entirety) together with a means of inducing (e.g., a component configured to induce) a voltage at or along the "device" surface of a sample without contact. (See also co-pending U.S. patent application Ser. No. 14/690,256, filed Apr. 17, 2015 titled "CHARGE DECAY MEASUREMENT SYSTEMS AND METHODS", published as U.S. Publication No. 2015/0331029, which is incorporated herein by reference in its entirety.) Such means or component may be either via backside contact with probes or a conductive chuck, involving capacitively coupled probes connected to a power source also in communication with backside contact probes or such a chuck, or by applying a changing magnetic field to the sample, with the purpose of inducing an external voltage field across its multilayer interfaces.

A transient electric field produced by a variable waveform (optionally AC) power supply (via any of the approaches above) induces an electric field across the interfaces of the multilayer semiconductor material. The relationship between the voltage and the material interface electrical field may be modeled by a transfer function or otherwise, including by accounting for various (capacitive or otherwise) external influences. The output of this function, given a particular amplitude and frequency of AC (or other) current, may be employed as a timing cue to trigger the laser shutter and/or photon counter simultaneously for SHG characterization of the testing point for constant near-instantaneous values of the electric field amplitude at the interfaces. As such, the system is able to simulate a constant (DC) voltage applied topside (i.e., at the device layer of the substrate) via contact electrical probes.

With direct application of AC to the backside of the sample, the system begins with the chuck at a 'neutral' or ground state, and bulk and device layers at an equilibrium potential. Then, an alternating bias is applied to the chuck, which is in galvanic contact with the bulk, or substrate layer of the multilayered semiconductor material. Since the device layer is separated from the bulk by the buried oxide layer, and not directly connected with a conductor, an electric potential field, or voltage will be created (i.e., induced) between the device and bulk layers.

Alternatively, capacitively coupled probe(s) that reside near (within about 1 to about 2 mm) but without touching the top side of the sample may be employed. A preferred approach in this regard may be a plate sized to cover (but not touch) the entire wafer, hovering with a small hole for the incident laser to pass through on its way to the sample and for the SHG beam to pass through on its way out of the sample.

In some implementations, a non-contacting electrode can be implemented using MEMS technology. For example, in an implementation, a Si wafer can be oxidized on both sides. A spiral or a grid-like electrode can then be placed by deposition on one or more locations of the wafer. The oxide material can be removed from the back-side of the wafer at those locations. An electro-magnetic field applied to the electrode can inductively bias the wafer in such implementations through near-field inductive coupling. The magnetic field produced by an external electric current can be used to generate an electric current across the wafer by inducing a current in the deposited electrode. Other methods of implementing non-contacting probes can also be used.

In any case, SHG methodology is used to interrogate the sample, for example, as further described in the portions of U.S. Provisional Application No. 61/980,860, filed on Apr. 17, 2014, titled "WAFER METROLOGY TECHNOLOGIES," referred to as Section I titled, "PUMP AND PROBE TYPE SHG METROLOGY," and/or Section III, titled "TEMPERATURE-CONTROLLED METROLOGY," both of which are incorporated herein by reference in their entirety. See also co-pending U.S. patent application Ser. No. 14/690,179, filed Apr. 17, 2015 titled "PUMP AND PROBE TYPE SECOND HARMONIC GENERATION METROLOGY", published as U.S. Publication No. 2015/0330908, which is incorporated herein by reference in its entirety. The same holds true with respect to the other embodiments discussed below.

Regardless, in the subject embodiments, since it is desirable to monitor SHG as a function of the voltage across the interfaces, the SHG signal will be synchronized with the power supply. This synchronization can be accomplished by controlling the laser(s) used for SHG signal production and SHG signal processing software, the laser(s) alone, or only the SHG signal processing software, in time with voltage changes. The voltage of the chuck can also be controlled.

An advantage of this synchronization is that voltage biased SHG measurements can be obtained that would be similar to DC biased SHG measurements, without using contact voltage bias probes on the front surface of the wafer. Instead of applying a DC bias, the system would use an AC bias synchronized with SHG measurement and/or generation to collect SHG data at discrete points on the voltage cycle. The AC bias could be applied using near-field inductive coupling, or via capacitive coupling of the sample. SHG data collected with these biasing techniques would yield the same material properties information as DC biased SHG.

To reduce or minimize noise and obtain statistically relevant indicator(s) of SHG intensity as a function of voltage across the interfaces, multiple photon counting windows may be desirable as further described below.

Induced Voltage Bias for Characterizing Interfacial Leakage

Systems and methods are described for characterizing interfacial leakage current and/or carrier injection energies between layers of layered (e.g., semiconductor) materials using SHG and a voltage change (such as an alternating, variable and/or pulsed voltage or current signal or a device that changes magnetic field in a manner to induce voltage change in a device layer of a sample) applied to the layered semiconductor material as per above.

By measuring the SHG response from optical pulses generated by a pulsed laser directed at a layered semiconductor/dielectrics structure while or shortly after an alternating, variable or pulsed voltage is applied to the layered semiconductor material, interfacial leakage current and/or carrier injection energies between layers can be characterized. In some embodiments, the time evolution of the SHG signal from interfaces as a function of the time constant of decay of the induced voltage can be measured. This yields information about charge carrier mobility across the interfaces.

Induced Voltage Bias for Characterizing Threshold Carrier Injection Energy

Systems and methods are described for SHG measurement applied in connection with a varied electrical field at a sample device layer in lieu of using tunable wavelength laser excitation to determine energy thresholds for photo-induced charge carrier injection into the dielectric in a layered semiconductor material. More specifically, to measure the threshold energy necessary for photo-induced charge carrier injection into the dielectric one can expose the material to a substantially monochromatic incident photon beam for SHG production and then incrementally change voltage across an interface of the exposed layered semiconductor material, measuring SHG signal count at each incremental voltage change until the SHG response has significant inflection or discontinuity or sudden change in slope from prior measurements. This change in slope could be a maximum or minimum (e.g., local maximum or minimum) or cusp, or step function, etc. The net charge change transfer due to all these processes can be described as the integral of the contributions of the 3rd harmonic injection current, "forward" leakage current to the dielectric due to the strong electric field, and "backward" discharge leakage current. Put in equation form:

$$Q(t)=\int(I_X+I_E-I_2)dt$$

Kinetic features of this curve shape (bending moment and saturation moments of time) will then provide information for determining threshold carrier injection energy.

BRIEF DESCRIPTION OF THE DRAWINGS

The figures diagrammatically illustrate aspects of various embodiments of different inventive variations.

DETAILED DESCRIPTION

Figure 1A:
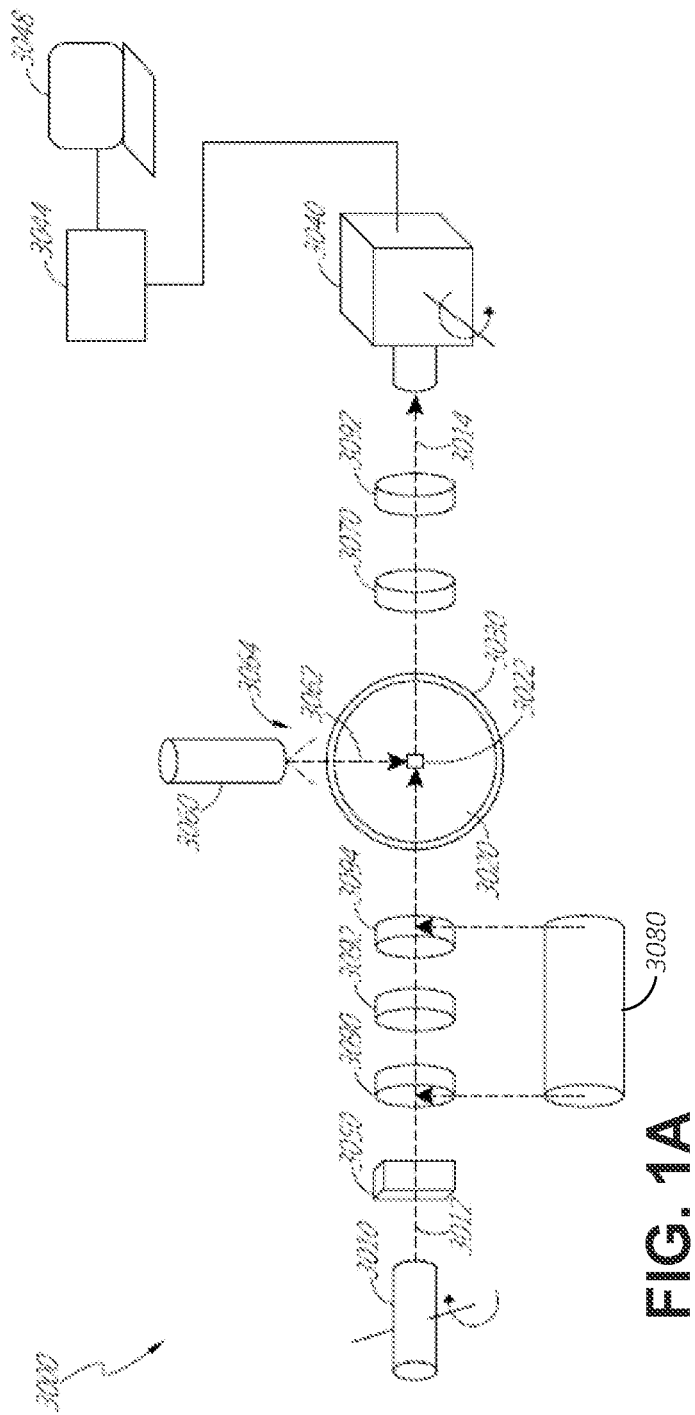
FIGS. 1A and 1B are schematic diagrams of SHG system components as may be used herein.
Figure 1B:
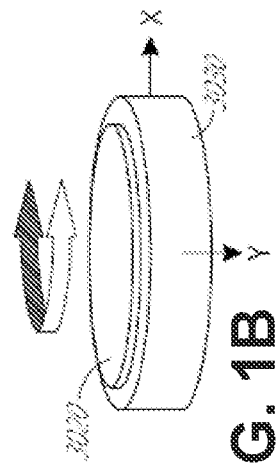

FIGS. 1A and 1B show suitable hardware for use in the subject systems and methods as further described in the portion of U.S. Provisional Application No. 61/980,860, filed on Apr. 17, 2014, titled "WAFER METROLOGY TECHNOLO- GIES," referred to as Section I entitled "PUMP AND PROBE TYPE SHG METROLOGY," which is incorporated by reference in its entirety. See also co-pending U.S. patent application Ser. No. 14/690,179, filed Apr. 17, 2015 titled "PUMP AND PROBE TYPE SECOND HARMONIC GENERATION METROLOGY", published as U.S. Publication No. 2015/0330908, which is incorporated herein by reference in its entirety. Other system and method options are presented in the portion of U.S. Provisional Application No. 61/980,860, filed on Apr. 17, 2014, titled "WAFER METROLOGY TECHNOLOGIES," referred to as Section II entitled "CHARGE DECAY MEASUREMENT SYSTEMS AND METHODS," for example, as to intermediate optics, the inclusion of optical delay line(s) and optional electrode features, which is incorporated herein by reference in its entirety. See also co-pending U.S. patent application Ser. No. 14/690,256, filed Apr. 17, 2015 titled "CHARGE DECAY MEASUREMENT SYSTEMS AND METHODS", published as U.S. Publication No. 2015/0331029, which is incorporated herein by reference in its entirety.

As shown, system 3000 includes a primary or probe laser 3010 for directing an interrogation beam 3012 of electromagnetic radiation at a sample wafer 3020, which is held by a vacuum chuck 3030. As illustrated in FIG. 1B, the chuck 3030 includes or is set on x- and y-stages and optionally also a rotational stage for positioning a sample site 3022 across the wafer relative to where the laser(s) are aimed. The x-y stage enables scanning multiple wafer surface sites or locations 3022 without movement of other hardware. A rotational stage optionally enables assessing crystal structure effects on SHG. Further optional features, aspects and/or uses of chuck 3030 are presented elsewhere in this application entitled. The sample site 3022 can include one or more layers. The sample site 3022 can comprise a composite substrate including at least two layers. The sample site 3022 can include an interface between two dissimilar materials (e.g., between two different semiconductor materials, between two differently doped semiconductor materials, between a semiconductor and an oxide, between a semiconductor and a dielectric material, between a semiconductor and a metal or an oxide and a metal).

When system 3000 is in use, a beam 3014 of reflected radiation directed at a detector 3040 will include an SHG signal. The detector 3040 may be any of a photomultiplier tube, a CCD camera, a avalanche detector, a photodiode detector, a streak camera and a silicon detector. System 3000 may also include one or more shutter-type devices 3050. The type of shutter hardware used will depend on the timeframe over which the laser radiation is to be blocked, dumped or otherwise directed away from the sample site 3022. An electro-optic blocking device such as a Pockel's Cell or Kerr Cell can be used to obtain very short blocking periods (i.e., with actuation times on the order of $10^{-9}$ to $10^{-12}$ seconds).

For longer blocking time intervals (e.g., from about $10^{-5}$ seconds and upwards) mechanical shutters or flywheel chopper type devices may be employed. However, electro-optic blocking devices will allow a wider range of materials to be tested in accordance with the methods below. A photon counting system 3044 capable of discretely gating very small time intervals, typically, on the order of picoseconds to microseconds can be employed to resolve the time-dependent signal counts. For faster-yet time frames optical delay line(s) may be incorporated as noted above.

System 3000 can include an additional electromagnetic radiation source 3060 also referred to as a pump source. In various implementations, the radiation source 3060 can be a laser illustrated as emitting a directed beam 3062 or a UV flash lamp emitting a diverging or optically collimated pulse 3064. In the case of a laser source, its beam 3062 may be collinear with beam 3012 (e.g., as directed by additional mirrors or prisms, etc.) Source 3060 output wavelengths of light may be anywhere from about 80 nm and about 1000 nm. Using shorter wavelengths in this range (e.g. less than about 450 nm), is possible to drive charge excitation using fewer photons and/or with lower peak intensities than at longer wavelengths.

For a flash lamp, energy per flash or power level during flash may be substrate material dependent. A flashlamp producing a total energy of 1 J to 10 kJ per flash would be appropriate for fully depleted silicon-on-insulator (FD-SOI). However a pulsed or constant UV source would be viable as well. The important factor in the pump characteristics and use is that charge carriers are injected into the dielectric of the material to be interrogated. Manufacturers of suitable flash lamps include Hellma USA, Inc. and Hamamatsu Photonics K.K.

When a laser is employed as source 3060, it may be any of a nanosecond, picosecond or femtosecond or faster pulse laser source. It may even be a continuous solid-state laser. In various embodiments, the pump source is tunable in wavelength. Commercially available options regarding lasers which are tunable include Spectra Physics' Velocity and Vortex Tunable Lasers. Additional tunable solid state solutions are available from LOTIS Ltd.'s LT-22xx series of solid state lasers.

Whether provided as a laser or a flash lamp, pump source 3060 can be selected for relatively high average power. This could be from about 10 mW to about 10 W, but more typically from about 100 mW to about 4 W, depending on material to be interrogated (as, again, the consideration is ensuring that charge carrier mobility is induced in a way such that charge carriers are injected into the interface of the material (e.g., the dielectric interface), which can be material specific. The average power of the pump source 3060 is selected to be below the optical damage threshold of the material. For example, pump source 3060 can be selected to have an average optical power between 1-2 W when the interrogating material comprises silicon so as to not exceed the optical damage threshold for silicon.

Probe laser 3010 may be any of a nanosecond, picosecond or femtosecond or faster pulse laser source. Two options are currently commercially available regarding lasers have the peak power, wavelength and reliability needed are doped fiber and Ti:Sapphire units. Coherent's VITESSE and Spectra Physics' MM TAI lasers are examples of suitable Ti:Sapphire devices. Femtolasers Gmbh and others manufacture also manufacture other relevant Ti:Sapphire devices. Suitable doped fiber lasers are produced by IMRA. OneFive, and Toptica Photonics. Pico- and/or nano-second lasers from many manufacturers, such as Hamamatsu, may be options as well depending on the substrate material and pump type. Laser 3010 may operate in a wavelength range between about 100 nm to about 2000 nm with a peak power between about 10 kW and 1 GW, but delivering power at an average below about 150 mW.

Various other optional so-called "intermediate" optical components may be employed in system 3000. For example, the system 3000 may include a dichroic reflective or refractive filter 3070 for selectively passing the SHG signal coaxial with reflected radiation directly from laser 3010 and/or source 3060. Alternatively, a prism may be employed to differentiate the weaker SHG signal from the many-orders-of-magnitude-stronger reflected primary beam. However, as the prism approach has proved to be very sensitive to misalignment, a dichroic system as referenced above may be preferred. Other options include the use of diffraction grating or a Pellicle beam splitter. An optical bundle 3080 for focusing and collimating/columniation optics may be provided. Alternatively, a filter wheel 3090, polarizer(s) 3092 and/or zoom len(s) 3094 units or assemblies may be employed in the system. Also, an angular (or arc-type) rotational adjustment (with corresponding adjustment for the detector) and in-line optical components may be desirable.

The output from the detector 3040 and/or the photon counting system 3044 can be input to an electronic device 3048. The electronic device 3048 can be a computing device, a computer, a tablet, a microcontroller or a FPGA. The electronic device 3048 includes a processor that may be configured to execute one or more software modules. In addition to executing an operating system, the processor may be configured to execute one or more software applications, including a web browser, a telephone application, an email program, or any other software application. The electronic device 3048 can implement the methods discussed herein by executing instructions included in a machine-readable non-transitory storage medium, such as a RAM, ROM, EEPROM, etc. The electronic device 3048 can include a display device and/or a graphic user interface to interact with a user. The electronic device 3048 can communicate with one or more devices over a network interface. The network interface can include transmitters, receivers and/or transceivers that can communicate such as, for example, wired Ethernet, Bluetooth®, or wireless connections.

Regarding other options, since an SHG signal is weak compared to the reflected beam that produces it, it is desirable to improve the signal-to-noise ratio of SHG counts. As photon counting gate times for the photon counting system 3044 decrease for the blocking and/or delay processes described herein, improvement becomes even more important. One method of reducing noise that may be employed is to actively cool the photon counter. This can be done using cryogenic fluids such as liquid nitrogen or helium or solid state cooling through use of a Peltier device. Others areas of improvement may include use of a Marx Bank Circuit (MBC) as relevant to shutter speed. Moreover, system 3000 may be incorporated in-line within a production line environment. Production line elements preceding or following system 100 may include any of epitaxial growth system, lithography and/or deposition (CVD, PVD, sputtering, etc.) systems.

Figure 2A:
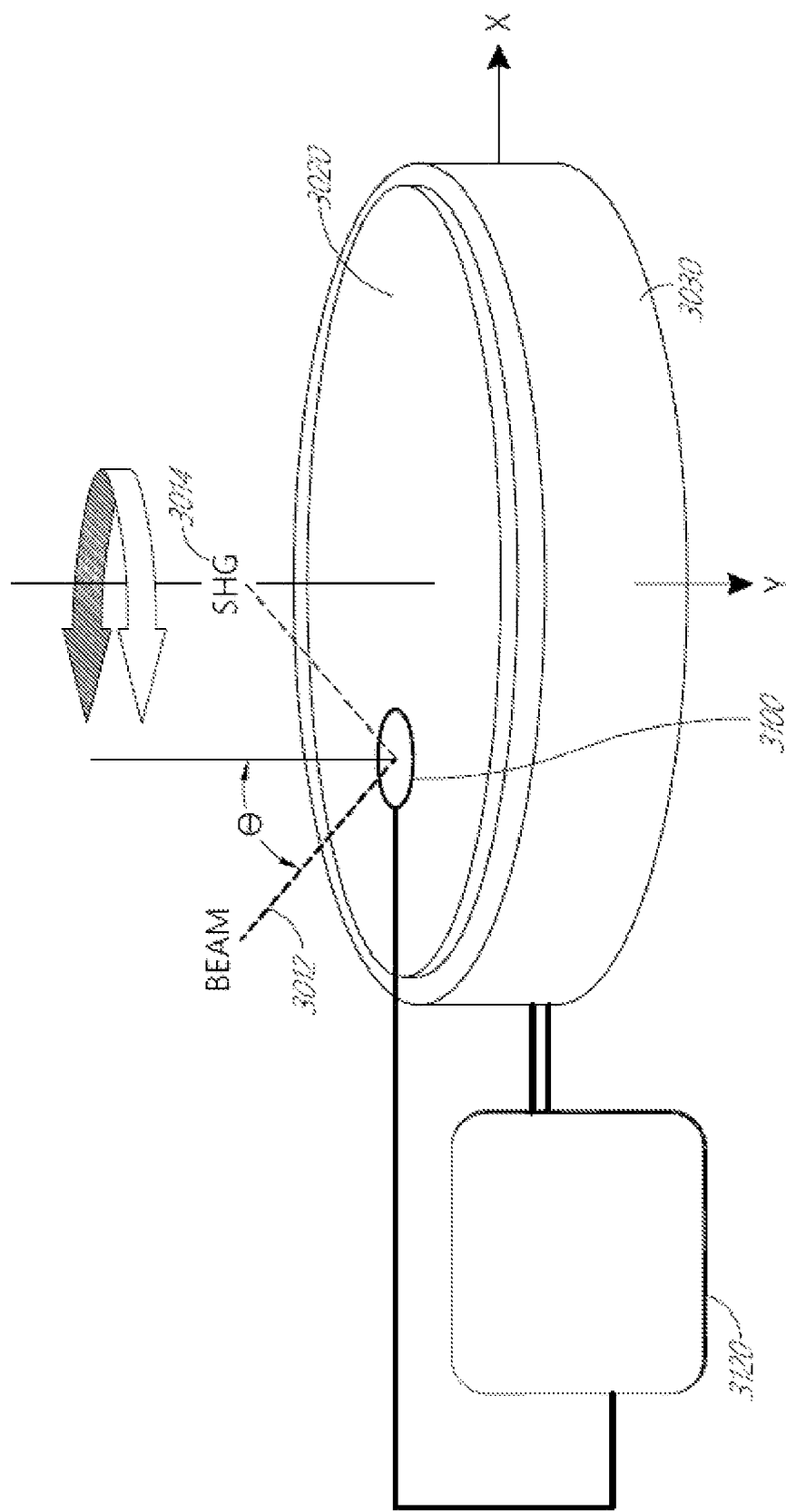
FIG. 2A is a perspective view of a first chuck configuration hereof.
Figure 2B:
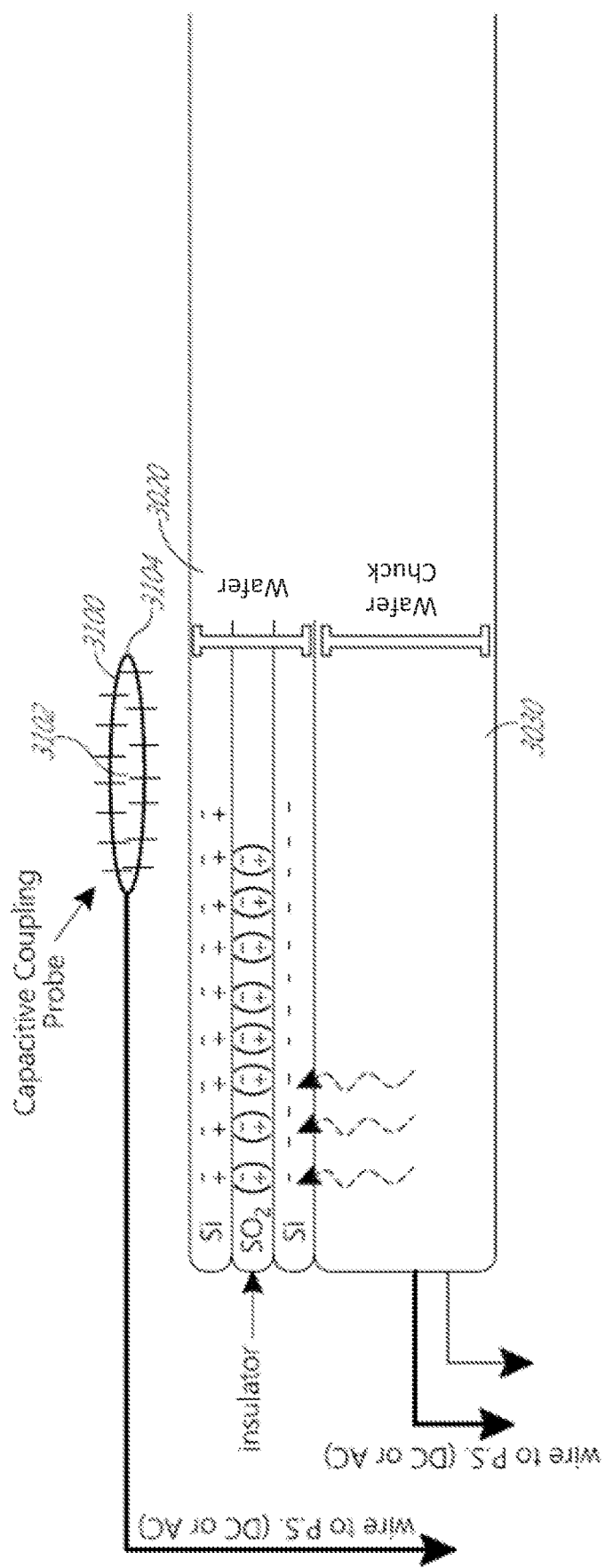
FIG. 2B is a side-sectional view of the chuck configuration in FIG. 2A.

In any case, FIGS. 2A and 2B provide views of a first set of purpose-specific chuck hardware that may be employed in the subject SHG system. The chuck 3030 holds a wafer 3020 by vacuum thereto or other means. The chuck 3030 is conductive and connected to a power supply. Optionally, a capacitive coupling probe 3100 is also connected to the power supply 3120. The power supply may be computer controlled, or at least its output is coordinated by computer for timing reasons as summarized above. The probe 3100 may likewise be controlled and/or monitored. It will be controlled in the sense that it will be part of a capacitive circuit attached to the power supply 3120. It may be monitored along with the chuck 3030 by a voltmeter to ensure that voltage is being induced as intended.

The probe 3100 includes a hole 3102 or port (e.g., 0.2 mm in diameter) in its ring 3104 to allow the optical beams 3012, 3014 (interrogation beam(s) and reflected SHG beam) to pass unblocked, and is fixed relative to the optics so that it moves or stays with the optical elements to remain centered on the (re)positioned sample site 3022 as the device surface is scanned. The coupling (indicated as having a positive "+" charge) is positioned close to the sample device surface (e.g., within about 1 mm to about 2 mm) but does not touch. It is supported by a cantilever arm or otherwise. The probe 3100 may be provided as a ring 3104 as shown in FIG. 2B, or it may comprise a larger disc or plate.

With the example shown in cross section in FIG. 2B, a wafer 3020 or device surface (comprising silicon) is separated from a silicon bulk layer by $SiO_2$ insulator. Thus, as explained above, the need for inductive bias to the device surface because it is otherwise (at least substantially) electrically insulated or isolated from the underlying silicon in contact with the conductive chuck 3030.

Figure 3A:
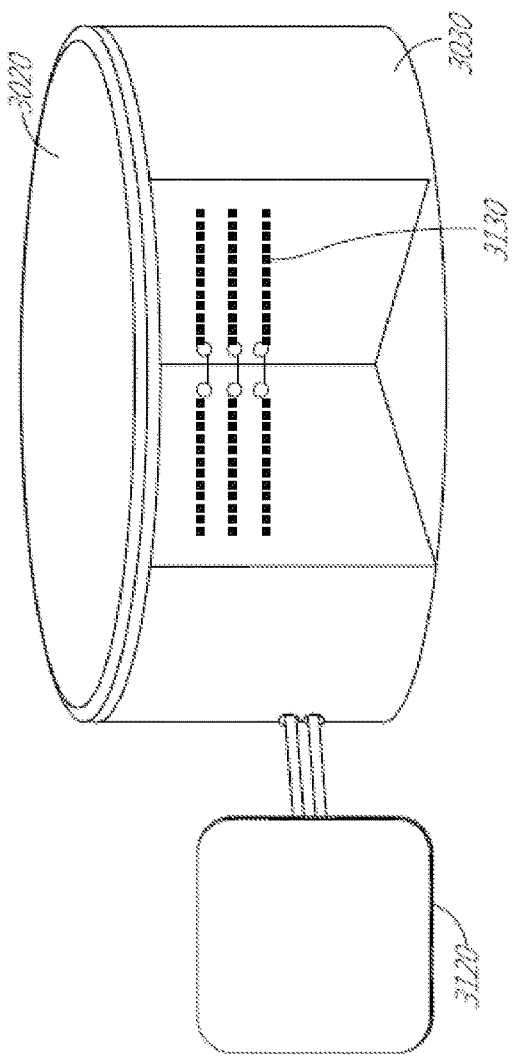
FIGS. 3A and 3B are partial cutaway, perspective views of a second chuck configuration hereof.
Figure 3B:
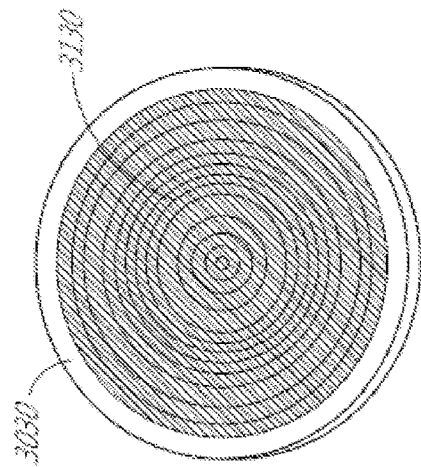
Figure 3C:
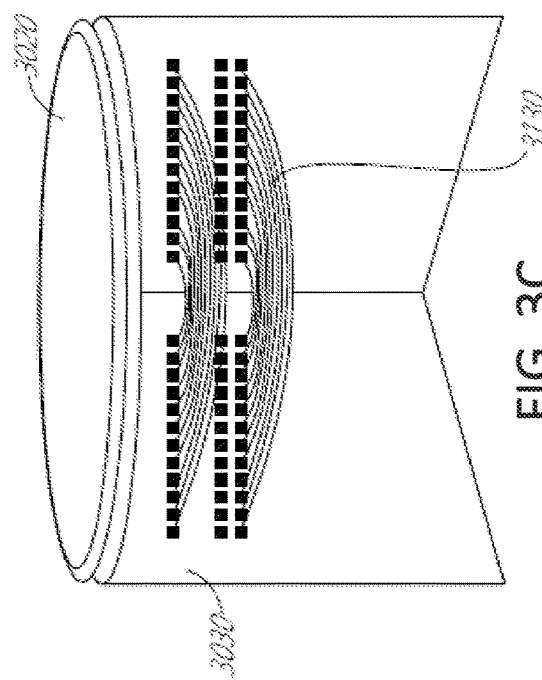
FIG. 3C is cutaway top view of the chuck in FIG. 3A/3B.

FIGS. 3A-3C detail an electromagnetic chuck 3030 that includes electrical coil(s) 3130 connected to a power supply 3120. In use, the wafer 3020 sits and is secured on top of the chuck 3030. When an alternating current (AC) is applied to the coil(s) 3130, this generates an alternating magnetic field through the wafer 3020. The magnetic field induces an electric potential across the wafer 3020 including its device surface. This electric field then enables the various modes of SHG interrogation noted above, some of which are detailed below. Alternatively, DC current may be applied to the coils 3130 which are oriented parallel to the chuck 3030, creating a constant magnetic field across the chuck for other effects as described above.

Figure 4A:
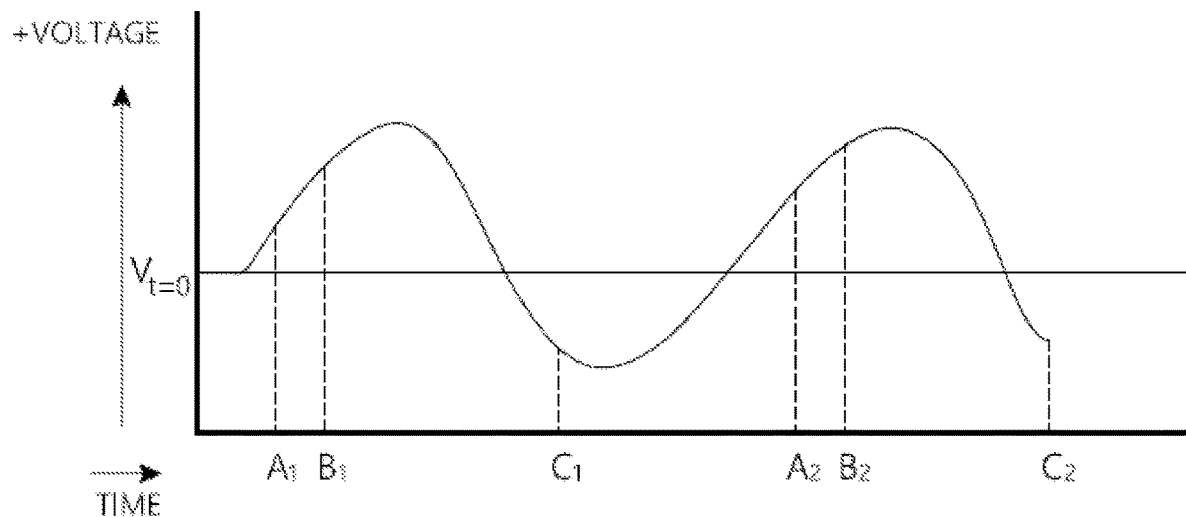
FIGS. 4A and 4B relate to AC voltage applied to and exhibited in a sample for DC bias probe elimination.
Figure 4B:
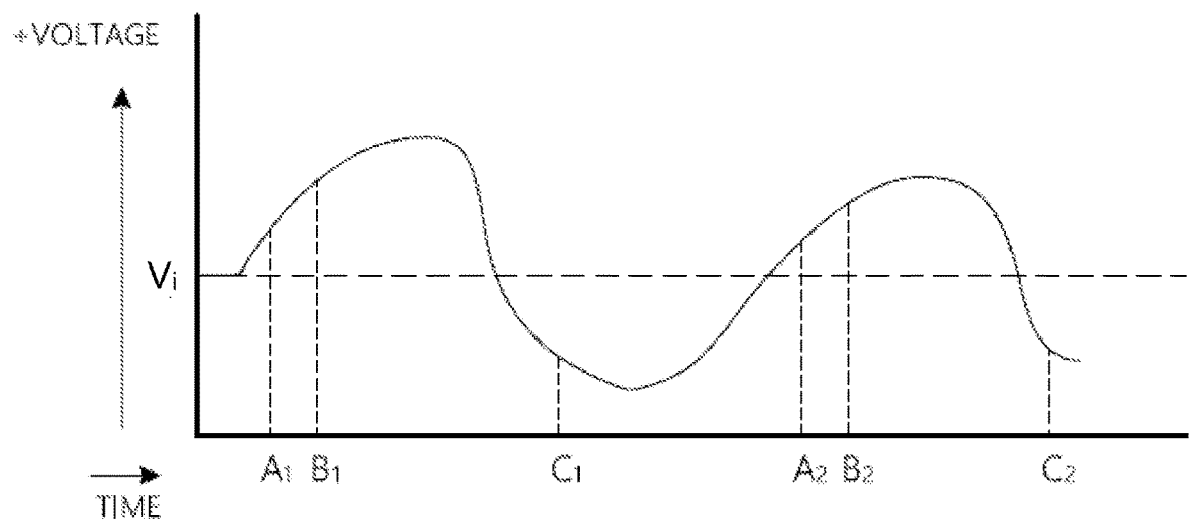
Figure 5A:
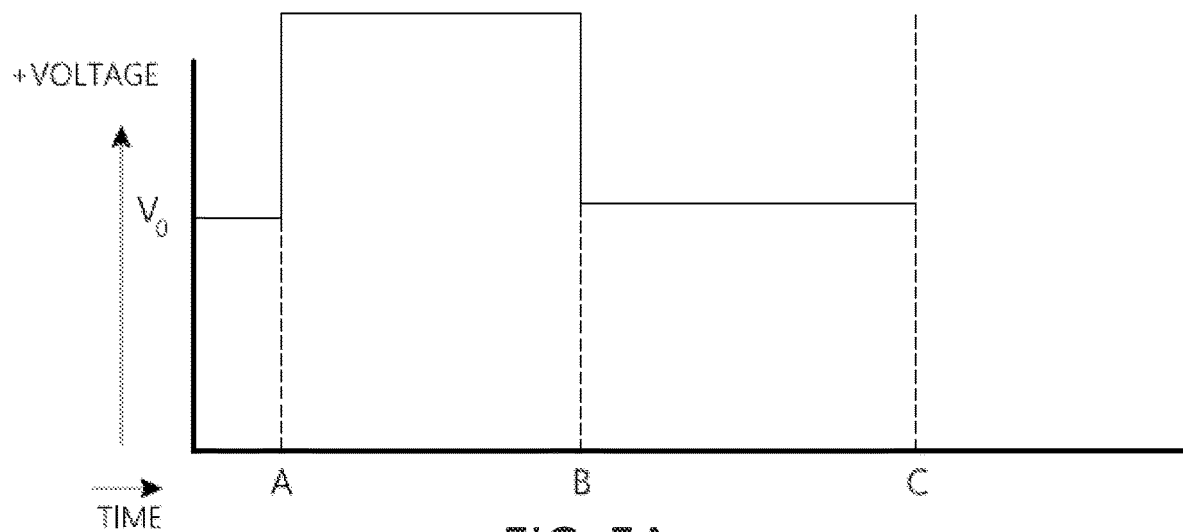
FIGS. 5A and 5B relate to AC voltage applied to and exhibited in a sample for testing leakage current.
Figure 5B:
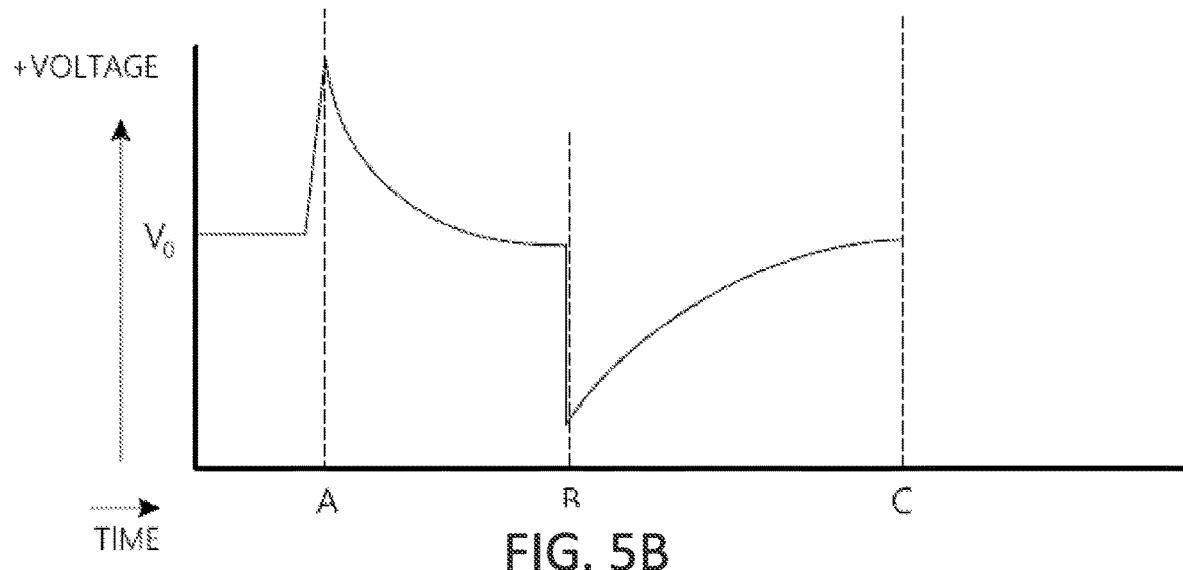

FIG. 4A shows an example AC voltage (V) profile (sinusoidal wave) applied to the substrate bulk layer over time. FIG. 4B shows a hypothetical response for induced voltage between the device and bulk layers ($V_i$) of the substrate on which the device is fabricated. In various embodiments, the substrate can comprise the silicon wafer or a portion of a semiconductor material. FIG. 5A shows an example AC voltage ($V_o$) profile (square wave) applied to the substrate bulk layer over time. FIG. 5B shows a hypothetical response for induced voltage between the device and bulk layers ($V_i$). Notably, the voltage input in either of FIG. 4A or 5A may differ from that shown, and could potentially be applied in steps, ramps, sine waves, or other forms.

More specifically regarding FIGS. 4A and 4B, as alluded to above, in order to minimize noise and obtain statistically relevant indicator(s) of SHG intensity as a function of voltage across the interfaces, multiple photon counting windows may be desirable. For such purposes, example points A1 and A2 are timed so that the voltage between the bulk and device layers, voltage A, is the same for both points. This is true for example points B1 and B2 at voltage B, and example points C1 and C2 at voltage C. Using voltage A as an example, SHG is recorded, and counts at points A1 can be summed with counts at point A2 and further at A3, A4, $A_n$ . . . in an arbitrarily long series depending on the desired measurement time. The total number of counts measured in this period is then divided by the time over which this "gate" spans as a way of finding the average number of counts per second, so that SHG intensity can be plotted as a function of bulk-device voltage A. The same method can be used to obtain measurements for voltage B at points B1 and B2 as well as at B3, B4, $B_n$ . . . in an arbitrarily long series depending on the desired measurement time. The total number of counts measured in this period is then divided by the time over which this "gate" spans as a way of finding the average number of counts per second, so that SHG intensity can be plotted as a function of bulk-device voltage B. Likewise, this method can be used to obtain measurements for voltage C at points C1 and C2 as well as at C3, C4, $C_n$ . . . in an arbitrarily long series depending on the desired measurement time. The total number of counts measured in this period is then divided by the time over which this "gate" spans as a way of finding the average number of counts per second, so that SHG intensity can be plotted as a function of bulk-device voltage C. Further details regarding the utility of SHG intensity as a function of bias voltage can be found in the DC biasing literature, an example of which is, "Charge Trapping in Irradiated SOI Wafers Measured by Second Harmonic Generation," IEEE Transactions on Nuclear Science, Vol. 51, No. 6. December 2004 and "Optical probing of a silicon integrated circuit using electric-field-induced second-harmonic generation," Applied Physics Letters 88, 114107, (2006), each of which publication is incorporated herein by reference in its entirety.

More specifically regarding FIGS. 5A and 5B, these figures illustrate an example for interrogating a Silicon-On-Insulator (SOI) device. In this example, a conductive chuck begins at a 'neutral' ground state, and bulk and device layers being at an equilibrium potential. At moment 'A', voltage applied to the chuck is changed rapidly, applying that voltage to the sample's conductive bulk layer. Since the sample's device layer is separated from the bulk by a thin buried oxide layer and not directly connected with a conductor, an electric potential field, or voltage will be induced between the device and bulk layers. Between times 'A' and the voltage applied to the chuck is not changed. Since the dielectric between the bulk and device layers is not perfect, the induced potential will drive a leakage current between the layers, causing the potential between the bulk and device layers to return to its natural state. This spike and decay in electric field is then monitored via SHG to provide insight to the leakage current. At time 'B' the voltage applied to the chuck is returned to ground, causing the voltage across the interface to reverse.

The systems and methods described herein can be used to characterize a sample (e.g., a semiconductor wafer or a portion thereof). For example, the systems and methods described herein can be used to detect defects or contaminants in the sample as discussed above. The systems and methods described herein can be configured to characterize the sample during fabrication or production of the semiconductor wafer. Thus, the systems and methods can be used along a semiconductor fabrication line in a semiconductor fabrication facility. The systems and methods described herein can be integrated with the semiconductor fabrication/production line. The systems and methods described herein can be integrated into a semiconductor fab line with automated wafer handling capabilities. For example, the system can be equipped with an attached Equipment Front End Module (EFEM), which accepts wafer cassettes such as a Front Opening Unified Pod (FOUP). Each of these cassettes can be delivered to the machine by human operators or by automated cassette-handling robots which move cassettes from process to process along fabrication/production line.

In various embodiments, the system can be configured such that once the cassettes are mounted on the EFEM, the FOUP is opened, and a robotic arm selects individual wafers from the FOUP and moves them through an automatically actuated door included in the system, into a light-tight process box, and onto a bias-capable vacuum chuck. The chuck may be designed to fit complementary with the robotic arm so that it may lay the sample on top. At some point in this process, the wafer can be held over a scanner for identification of its unique laser mark.

Accordingly, a system configured to be integrated in a semiconductor fabrication/assembly line can have automated wafer handling capability from the FOUP or other type of cassette; integration with an EFEM as discussed above, a chuck designed in a way to be compatible with robotic handling, automated light-tight doors which open and close to allow movement of the robotic wand/arm and software signaling to EFEM for wafer loading/unloading and wafer identification.

As described above each of Sections I, II, III, and IV of U.S. Provisional Application No. 61/980,860, filed on Apr. 17, 2014, titled "WAFER METROLOGY TECHNOLOGIES," are incorporated herein by reference in their entirety. Similarly, co-pending patent applications (i) U.S. patent application Ser. No. 14/690,179, filed Apr. 17, 2015 titled "PUMP AND PROBE TYPE SECOND HARMONIC GENERATION METROLOGY", published as U.S. Publication No. 2015/0330908, and (ii) U.S. patent application Ser. No. 14/690,256, filed Apr. 17, 2015 titled "CHARGE DECAY MEASUREMENT SYSTEMS AND METHODS", published as U.S. Publication No. 2015/0331029, are each incorporated herein by reference in their entirety. PCT Application No. PCT/US2015/026263, filed Apr. 16, 2015 titled "WAFER METROLOGY TECHNOLOGIES" is also incorporated herein by reference in its entirety. Accordingly, features from the disclosure of any of these documents incorporated by reference may be combined with any features recited elsewhere herein.

Variations

Example invention embodiments, together with details regarding a selection of features have been set forth above. As for other details, these may be appreciated in connection with the above-referenced patents and publications as well as is generally known or appreciated by those with skill in the art. The same may hold true with respect to method-based aspects of the invention in terms of additional acts as commonly or logically employed. Regarding such methods, including methods of manufacture and use, these may be carried out in any order of the events which is logically possible, as well as any recited order of events. Furthermore, where a range of values is provided, it is understood that every intervening value, between the upper and lower limit of that range and any other stated or intervening value in the stated range is encompassed within the invention. Also, it is contemplated that any optional feature of the inventive variations described may be set forth and claimed independently, or in combination with any one or more of the features described herein.

Though the invention embodiments have been described in reference to several examples, optionally incorporating various features, they are not to be limited to that which is described or indicated as contemplated with respect to each such variation. Changes may be made to any such invention embodiment described and equivalents (whether recited herein or not included for the sake of some brevity) may be substituted without departing from the true spirit and scope hereof.

The various illustrative processes described may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. The processor can be part of a computer system that also has a user interface port that communicates with a user interface, and which receives commands entered by a user, has at least one memory (e.g., hard drive or other comparable storage, and random access memory) that stores electronic information including a program that operates under control of the processor and with communication via the user interface port, and a video output that produces its output via any kind of video output format, e.g., VGA, DVI, HDMI, DisplayPort, or any other form.

A processor may also be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more example embodiments, the functions described may be implemented in hardware, software, firmware, or any combination thereof. If implemented in software, the functions may be stored on, transmitted over or resulting analysis/calculation data output as one or more instructions, code or other information on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. The memory storage can also be rotating magnetic hard disk drives, optical disk drives, or flash memory based storage drives or other such solid state, magnetic, or optical storage devices.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Operations as described herein can be carried out on or over a website. The website can be operated on a server computer, or operated locally, e.g., by being downloaded to the client computer, or operated via a server farm. The website can be accessed over a mobile phone or a PDA, or on any other client. The website can use HTML code in any form, e.g., MHTML, or XML, and via any form such as cascading style sheets ("CSS") or other.

Also, the inventors hereof intend that only those claims which use the words "means for" are to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The programs may be written in C, or Java, Brew or any other programming language. The programs may be resident on a storage medium, e.g., magnetic or optical, e.g the computer hard drive, a removable disk or media such as a memory stick or SD media, or other removable medium. The programs may also be run over a network, for example, with a server or other machine sending signals to the local machine, which allows the local machine to carry out the operations described herein.

It is also noted that all features, elements, components, functions, acts and steps described with respect to any embodiment provided herein are intended to be freely combinable and substitutable with those from any other embodiment. If a certain feature, element, component, function, or step is described with respect to only one embodiment, then it should be understood that that feature, element, component, function, or step can be used with every other embodiment described herein unless explicitly stated otherwise. This paragraph therefore serves as antecedent basis and written support for the introduction of claims, at any time, that combine features, elements, components, functions, and acts or steps from different embodiments, or that substitute features, elements, components, functions, and acts or steps from one embodiment with those of another, even if the following description does not explicitly state, in a particular instance, that such combinations or substitutions are possible. It is explicitly acknowledged that express recitation of every possible combination and substitution is overly burdensome, especially given that the permissibility of each and every such combination and substitution will be readily recognized by those of ordinary skill in the art.

In some instances entities are described herein as being coupled to other entities. It should be understood that the terms "interfit", "coupled" or "connected" (or any of these forms) may be used interchangeably herein and are generic to the direct coupling of two entities (without any non-negligible, e.g., parasitic, intervening entities) and the indirect coupling of two entities (with one or more non-negligible intervening entities). Where entities are shown as being directly coupled together, or described as coupled together without description of any intervening entity, it should be understood that those entities can be indirectly coupled together as well unless the context clearly dictates otherwise.

Reference to a singular item includes the possibility that there are a plurality of the same items present. More specifically, as used herein and in the appended claims, the singular forms "a," "an," "said," and "the" include plural referents unless specifically stated otherwise. In other words, use of the articles allow for "at least one" of the subject item in the description above as well as the claims below.

It is further noted that the claims may be drafted to exclude any optional element (e.g., elements designated as such by description herein a "typical," that "can" or "may" be used, etc.). Accordingly, this statement is intended to serve as antecedent basis for use of such exclusive terminology as "solely," "only" and the like in connection with the recitation of claim elements, or other use of a "negative" claim limitation language. Without the use of such exclusive terminology, the term "comprising" in the claims shall allow for the inclusion of any additional element—irrespective of whether a given number of elements are enumerated in the claim, or the addition of a feature could be regarded as transforming the nature of an element set forth in the claims. Yet, it is contemplated that any such "comprising" term in the claims may be amended to exclusive-type "consisting" language. Also, except as specifically defined herein, all technical and scientific terms used herein are to be given as broad a commonly understood meaning to those skilled in the art as possible while maintaining claim validity.

While the embodiments are susceptible to various modifications and alternative forms, specific examples thereof have been shown in the drawings and are herein described in detail. It should be understood, however, that these embodiments are not to be limited to the particular form disclosed, but to the contrary, these embodiments are to cover all modifications, equivalents, and alternatives falling within the spirit of the disclosure. Furthermore, any features, functions, acts, steps, or elements of the embodiments may be recited in or added to the claims, as well as negative limitations (as referenced above, or otherwise) that define the inventive scope of the claims by features, functions, steps, or elements that are not within that scope. Thus, the breadth of the inventive variations or invention embodiments are not to be limited to the examples provided, but only by the scope of the following claim language.

That being said, we claim:

1. A system for optically interrogating a surface of a sample while inducing an electric field across at least a portion of said sample, said system comprising:
    a first optical source configured to emit probing radiation, said first optical source disposed so as to direct said probing radiation onto said surface of said sample;
    an optical detector configured to detect second harmonic generated light from the sample;
    processing electronics configured to determine a characteristic of the detected second harmonic generated light; and
    a magnetic source configured to apply a changing magnetic field to said sample to inductively generate the electric field across at least a portion of said sample in addition to any electric field produced by said probing radiation;
    wherein the system is configured to synchronize the electric field with said probing radiation or with a gating of the optical detector.

2. The system of claim 1, wherein said magnetic source comprises one or more coils and a source of current electrically connected to said one or more coils.

3. The system of claim 1, wherein said magnetic source comprises an electro-magnet disposed in proximity to said sample to apply a magnetic field thereto.

4. The system of claim 1, wherein said probing radiation is synchronized with said electric field.

5. The system of claim 1, wherein said processing electronics is further configured for gating the optical detector in synchronization with said electric field.

6. The system of claim 1, wherein said electric field is varied.

7. The system of claim 1, wherein said electric field is modulated.

8. The system of claim 1, wherein said electric field is alternating.

9. The system of claim 2, wherein the source of current applies an alternating current to the coil.

10. The system of claim 1, wherein the changing magnetic field comprises an alternating magnetic field.

11. The system of claim 1, wherein the system is configured to synchronize the said probing radiation with the application of the changing magnetic field.

12. The system of claim 1, wherein the system synchronizes the electric field with pulses of the probing radiation.

* * * * *